United States Patent [19]

Kunimi et al.

[11] Patent Number: 4,538,114
[45] Date of Patent: Aug. 27, 1985

[54] DIFFERENTIAL AMPLIFIER

[75] Inventors: Nobuo Kunimi, Sayama; Koichi Shimizu, Yokohama; Toshiro Suzuki, Tama, all of Japan

[73] Assignee: Hitachi, Ltd., Tokyo, Japan

[21] Appl. No.: 528,656

[22] Filed: Sep. 1, 1983

[30] Foreign Application Priority Data

Sep. 3, 1982 [JP] Japan ................................ 57-152731

[51] Int. Cl.$^3$ ............................................ H03F 3/45
[52] U.S. Cl. ..................................... 330/253; 330/259; 330/311
[58] Field of Search ............... 330/253, 257, 260, 259, 330/277, 290, 311

[56] References Cited

U.S. PATENT DOCUMENTS

| 4,267,517 | 5/1981 | Iida et al. | 330/253 |
| 4,315,223 | 2/1982 | Haque | 330/253 |
| 4,383,223 | 5/1983 | Ulmer | 330/253 |
| 4,459,555 | 7/1984 | Jett, Jr. | 330/253 |

FOREIGN PATENT DOCUMENTS

| 0028932 | 5/1981 | European Pat. Off. |
| 1549310 | 7/1979 | United Kingdom. |
| 2038581 | 7/1980 | United Kingdom. |
| 1592800 | 7/1981 | United Kingdom. |
| 2070376 | 9/1981 | United Kingdom. |

Primary Examiner—James B. Mullins
Attorney, Agent, or Firm—Antonelli, Terry & Wands

[57] ABSTRACT

A differential amplifier formed of MISFETs includes a differential amplification stage and a pair of cascade amplification stages which receive outputs from the differential amplification stage. In each of the cascade amplification stages, an amplifying MISFET which receives an input signal at its source has a channel conductivity of opposite type to that of the differential input MISFETs of the differential amplification stage. The differential amplifier with this construction has good frequency characteristics. Since the pair of cascade amplification stages make the currents taken from a pair of outputs from the differential amplification stage equal to each other, the operating balance of the differential amplification stage is not affected. The differential amplifier further includes a feedback circuit which detects the operating points of these cascade amplification stages by referring to the outputs of the cascade amplification stages, and generates a control voltage by comparing the operating points thus detected with a reference potential. The control voltage is fed back to the gates of the amplifying MISFETs in each cascade amplification stage. As a result, the operating point of each cascade amplification stage can be stabilized irrespective of variations in the characteristics of the MISFETs or the changes of their characteristics.

9 Claims, 4 Drawing Figures

DIFFERENTIAL AMPLIFIER

BACKGROUND OF THE INVENTION

This invention relates to a differential amplifier and more particularly to a differential amplifier suitable for use in an MIS integrated circuit constituted of MISFETs (insulated-gate fieldeffect transistors).

A differential amplifier includes a differential input stage which consists of symmetric circuits, and can eliminate the in-phase component of differential inputs. Noise that is liable to be superimposed on a power source voltage can be regarded as in-phase noise by the differential amplifier, hence a differential amplifier has the advantage that the power source noise does not influence the output of the differential amplifier. In an integrated circuit including a logic circuit together with a substantially analog circuit, the power source voltage is likely to vary according to the logic operation of the circuit. Since a differential amplifier is virtually insensitive to power source noise, it can be fabricated extremely conveniently in an integrated circuit configuration together with the logic circuit.

With a differential amplifier, however, the output fluctuates even if the differential inputs are at the same level, when there is no stabilization point determined by the circuit itself. In other words, the differential amplifier has the problem that its operating point is not stabilized.

SUMMARY OF THE INVENTION

It is therefore an object of the present invention to provide a differential amplifier in which the operating point of the circuit is stabilized.

It is another object of the present invention to provide a differential amplifier which can operate at high speed and has a stabilized operating point.

It is still another object of the present invention to provide a differential amplifier which is suitable for a complementary MIS integrated circuit configuration.

It is still another object of the present invention to provide a differential amplifier which can improve the production yield of integrated circuits.

Other objects of the present invention will become more apparent from the following description taken in conjunction with the accompanying drawings.

In accordance with one embodiment of the invention which will be described later in further detail, the amplifier is provided with a resistor circuit which receives differential outputs from a cascade stage and a MISFET which is operated by a potential of an intermediate level between differential outputs produced by this resistor circuit. Negative feedback is applied to the cascade stage by a bias current flowing through this MISFET. The operating point of the output is stabilized at the intermediate point of the power source voltage (between $V_{DD}$ and $V_{ss}$) in response to the negative feedback operation.

DESCRIPTION OF THE PREFERRED EMBODIMENT

Hereinafter, preferred embodiments of the present invention will be described with reference to the accompanying drawings.

Figure 1:
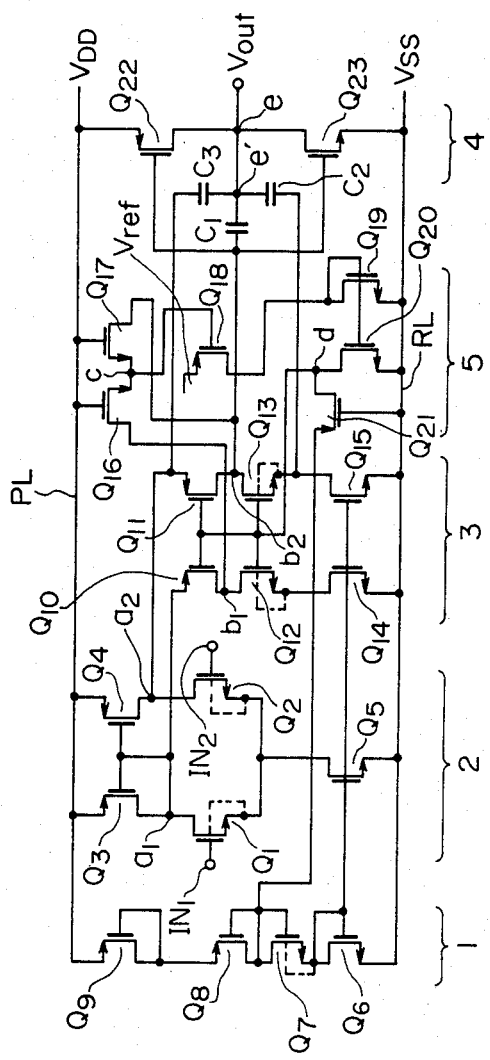
FIG. 1 is a circuit diagram of a differential amplifier in accordance with one embodiment of the present invention.

FIG. 1 shows a differential amplifier in accordance with one embodiment of the present invention. This amplifier includes a bias circuit 1, a differential input stage 2, a cascade stage 3 and an output stage 4.

The circuit shown in the diagram is formed on a single semiconductor substrate by known complementary MOS integrated circuit techniques.

The differential input stage 2 consists of a pair of differential input MISFETs $Q_1$, $Q_2$, load MISFETs $Q_3$, $Q_4$ forming a current-mirror circuit which is interposed between the drains of MISFETs $Q_1$, $Q_2$ and a power line PL, and a constant-current MISFET $Q_5$ which is interposed between the common source of the input MISFETs $Q_1$, $Q_2$ and a reference potential line RL.

Although the invention is not particularly limited to this, the input MISFETs $Q_1$, $Q_2$ are shown as N-channel type, the load MISFETs $Q_3$, $Q_4$ are of the P-channel type, opposite to the conductivity type of the former, and the constant-current MISFET $Q_5$ is of the N-channel type.

The input MISFETs $Q_1$ and $Q_2$ are constructed to have the same dimensions and characteristics with respect to each other. Similarly, the load MISFETs $Q_3$ and $Q_4$ forming the current-mirror circuit have the same dimensions and characteristics. This arrangement minimizes the offset voltage and drift of the differential input stage 2.

In the diagram, the substrate gates of the N-channel MISFETs $Q_1$, $Q_2$, $Q_7$, $Q_{12}$ and $Q_{13}$ are represented by dashed lines. The substrate gates of the rest of the MISFETs are now shown in order to simplify the diagram. The substrate gates of the P-channel MISFETs, now shown, should be interpreted as being connected to the point of the circuit with the maximum potential, i.e. the power line PL. The substrate gates of the N-channel MISFETs that are not shown should be interpreted as being connected to the reference potential line RL.

Figure 2:
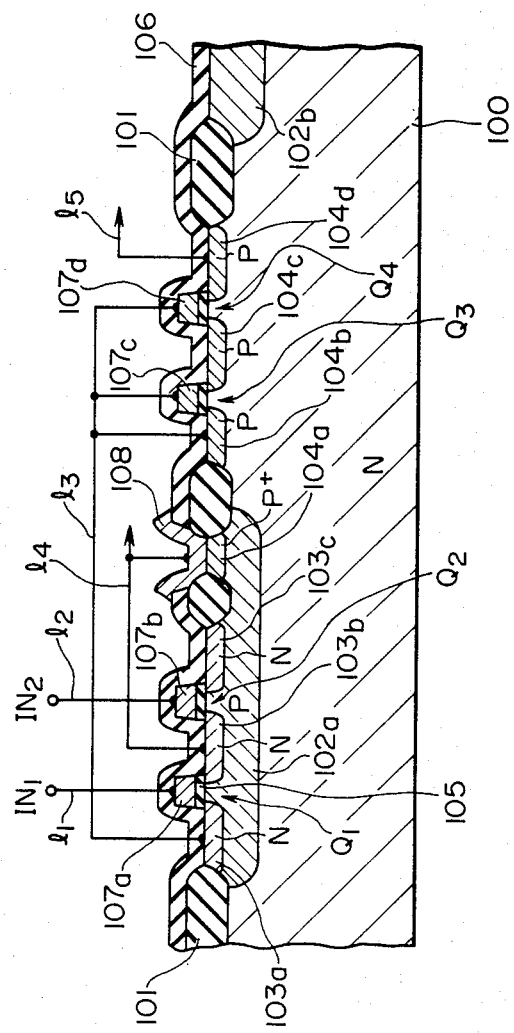
FIG. 2 is a cross-sectional view of a complementary MIS integrated circuit.

FIG. 2 shows a cross-section of a CMOS integrated circuit. A relatively thick field oxide film 101 is formed by known selective oxidation techniques on the surface of an N-type monocrystalline silicon substrate 100 over the regions other than the regions which are to become active regions. A P-type well region 102a for forming the N-channel MISFETs $Q_1$, $Q_2$ and a P-type well region 102b for forming other N-channel MISFETs are formed on the surface of the substrate 100. The N-channel MISFET $Q_1$ consists of a gate electrode 107a consisting of a polysilicon layer formmed on the P-type well region 102a through a relatively thin gate oxide film 105, a drain region 103a consisting of an N-type silicon region which is formed on the surface of the P-type well region 102a by utilizing the gate electrode 107a as a kind of impurity doping mask, and a common source region 103b. The N-channel MISFET $Q_2$ has the same construction as MISFET $Q_1$. These MISFETs $Q_1$ and $Q_2$ are formed on the well region 102a close to each other as shown in the figure. If the fabrication conditions of the integrated circuit vary somewhat, therefore, the characteristics of these MIFETs vary in a similar way. In other words, any relative variation in the characteristics of the MISFETs $Q_1$ and $Q_2$ is small. Since these MISFETs $Q_1$ and $Q_2$ are formed close to each other, they operate at substantially the same operating temperatures. Hence, they exhibit the same characteristics irrespective of their individual temperature characteristics.

The P-type well region 102a acting as the common substrate gate for MISFETs $Q_1$, $Q_2$ is connected to the common source region 103b through a contact region 104a and conductor layers 108 and 14, each of which could be a vacuum-evaporated aluminum layer for example. The gate electrodes 107a and 107b are connected to terminals $IN_1$ and $IN_2$ through conductor layers $l_1$ and $l_2$, which could be vacuum-evaporated aluminum layers for example. The terminals $IN_1$ and $IN_2$ could be bonding pads formed on the surface of the substrate 100, and are not shown in the figure.

The P-type well region 102b forms a common substrate gate for a plurality of N-channel MISFETs that are formed on the surface of the P-type well region 102b and are not shown in the figure. The well region 102b is connected to the reference potential line RL (see FIG. 1).

The P-channel MISFETs $Q_3$, $Q_4$, etc., are formed on the surface of the substrate 100, which forms the common substrate gate for the P-channel MISFETs and is connected to the power line PL.

Since the potential of the substrate gates of the differential input MISFETs $Q_1$ and $Q_2$ are made equal to their respective source potentials, they are not affected much by changes in their characteristics due to known substrate effects.

Returning to FIG. 1, the bias circuit 1 consists of a constant-current MISFET $Q_6$ which forms a current-mirror circuit with the constant-current MISFET $Q_5$ of the differential input stage 2 and MISFETs $Q_{14}$, $Q_{15}$, and which supplies a bias to these MISFETs, and load MISFETs $Q_7$, $Q_8$, $Q_9$ connected in series between the drain of the constant-current MISFET $Q_6$ and the power source voltage $V_{DD}$.

The MISFETs $Q_6$ to $Q_9$ that form the bias circuit 1 are constructed so as to have an appropriate conductance ratio with respect to one another. A constant voltage obtained by dividing the voltage across the power terminals $V_{DD}$ and $V_{ss}$ by this conductance ratio is applied to MISFET $Q_5$ of the differential input stage 2. As a result, MISFET $Q_5$ is made to operate as a constant-current source.

The cascade stage 3 consists of a pair of P-channel MISFETs $Q_{10}$, $Q_{11}$ forming a gate-ground circuit, MISFETs $Q_{12}$, $Q_{13}$ connected to the drains of MISFETs $Q_{10}$, $Q_{11}$, respectively, and constant-current MISFETs $Q_{14}$, $Q_{15}$ that are connected in series between MISFETs $Q_{12}$, $Q_{13}$ and the power source voltage $V_{DD}$.

The MISFETs $Q_{14}$ and $Q_{15}$ form the current-mirror circuit together with the constant-current MISFET $Q_6$ of the bias circuit 1, as described above. Since MISFETs $Q_{14}$ and $Q_{15}$ are made to operate as a constant-current source in this manner, the cascade stage 3 is biased by the bias circuit 1.

According to this construction, the differential output taken from nodes $a_1$ and $a_2$ on the drain side of the differential input MISFETs $Q_1$ and $Q_2$ forming the input stage 2 is input to the sources of MISFETs $Q_{10}$ and $Q_{11}$. According to the circuit shown in the figure, moreover, MISFETs $Q_{10}$ and $Q_{11}$ substantially form a gateground circuit so that the adverse influence of the mirror capacity upon the circuit operation, that would occur if it were a gate input, can be eliminated and hence the cascade stage 3 can operate at high speed.

The MISFETs $Q_{10}$, $Q_{12}$ and $Q_{14}$ on one side of the cascade stage 3 optimize the operating conditions of the input stage 2 and improve the balance of the cascade stage 3. In other words, a current which is to flow through MISFETs $Q_{10}$ and $Q_{11}$ is generated by branching off part of the current of the load MISFETs $Q_3$ and $Q_4$ of the input stage 2. If MISFETs $Q_{10}$, $Q_{12}$ and $Q_{14}$ were not provided, therefore, the current flowing through MISFET $Q_3$ will be different from the current flowing through MISFET $Q_4$; hence, the level at node $a_2$ would drop.

The drop of level at node $a_2$ can be prevented by, for example, making the mutual conductance of MISFET $Q_4$ greater than that of MISFET $Q_3$, or by making the current amplification ratio of the current-mirror circuit of $Q_3$ and $Q_4$ greater than 1. Care must be taken in this case because relative changes or variations in the characteristics of these MISFETs $Q_3$ and $Q_4$ will occur because their dimensions are different. If at least MISFET $Q_{10}$ is provided, the operating current of MISFET $Q_3$ can be balanced with that of $Q_4$, and their dimensions can also be balanced with each other.

If the embodiment described above, the output of the circuit consisting of MISFETs $Q_{11}$, $Q_{13}$ and $Q_{15}$ is used to raise the operating point of the cascade stage 3 to an appropriate level.

In the cascade stage 3 shown in the figure, MISFETs $Q_{12}$ and $Q_{13}$ are not always necessary. When these MISFETs are omitted, the constant-current MISFETs $Q_{14}$ and $Q_{15}$ constitute the drain load of the input MISFETs $Q_{10}$ and $Q_{11}$. Accordingly, output signals can be obtained from the drains of MISFETs $Q_{10}$ and $Q_{11}$ even when MISFETs $Q_{12}$ and $Q_{13}$ are not provided.

MISFETs $Q_{12}$ and $Q_{13}$ of the cascade stage 3 are provided in order to improve the bias stability. If these transistors are not provided, the voltages between the drains and sources of MISFETs $Q_{14}$ and $Q_{15}$ will increase, and the drain currents of the constant-current MISFETs $Q_{14}$ and $Q_{15}$ will therefore increase due to the well-known effective channel-length modulation effect. In contrast, the voltage between the drain and source of MISFET $Q_6$ in the bias circuit 1 is made to have a relatively low value in response to the voltage drop across each of MISFETs $Q_9$, $Q_8$ and $Q_7$. As a result, the current-mirror ratio (current amplification ratio) of MISFET $Q_6$ to MISFETs $Q_{14}$ and $Q_{15}$ does not correspond very well to the size ratio of MISFET $Q_6$ to MISFETs $Q_{14}$ and $Q_{15}$. Undesirable changes in the current-mirror ratio due to changes in the voltage level mean undesirable changes of the drain outputs of MISFETs $Q_{10}$ and $Q_{11}$.

Accordingly, this embodiment inserts MISFETs $Q_{12}$ and $Q_{13}$ between MISFETs $Q_{10}$ and $Q_{14}$ and between MISFETs $Q_{11}$ and $Q_{15}$, respectively, of the cascade stage 3.

Although the invention is not particularly limited to this, this embodiment has the conductance ratio of MISFETs $Q_3$, $Q_{10}$, $Q_{12}$ and $Q_{14}$ and the conductance ratio of MISFETs $Q_4$, $Q_{11}$, $Q_{13}$ and $Q_{15}$ agree with the conductance ratio of MISFETs $Q_9$, $Q_8$, $Q_7$ and $Q_6$ of the bias circuit 1. This stabilizes the bias point of the cascade stage 3. If these conductance ratios do not agree with one another, the bias point will change even with a slight change in the power source voltage.

Next a feedback system for the cascade stage 3 will be described.

MISFETs $Q_{16}$ to $Q_{21}$ form a feedback circuit 5. The drain voltage of MISFETs $Q_{10}$ and $Q_{11}$, that is, the potentials at output nodes $b_1$ and $b_2$ of the cascade stage 3, are applied to the two ends of a pair of N-channel MISFETs $Q_{16}$ and $Q_{17}$ connected in series. The power source voltage $V_{DD}$ is applied to the gate terminals of MISFETs $Q_{16}$ and $Q_{17}$ so that these transistors operate as resistors with relatively high resistances. Accordingly, these transistors $Q_{16}$ and $Q_{17}$ constitute a kind of a voltage dividing resistor circuit that generates a voltage of an intermediate level between the potentials of the output nodes $b_1$ and $b_2$ of the cascade stage 3.

These MISFETs $Q_{16}$ and $Q_{17}$ have equal resistances between their sources and drains which can be as high as approximately 200 K ohms. In the normal operating state in which a level difference is generated between the output nodes $b_1$, $b_2$ of the cascade stage 3, this high resistance prevents a large current from flowing through MISFETs $Q_{16}$ and $Q_{17}$. In other words, the resistance prevents the output level (the level at node $b_2$) from being affected by MISFETs $Q_{16}$ and $Q_{17}$.

The gate of MISFET $Q_{18}$ is connected to the common source (node c) of MISFETs $Q_{16}$ and $Q_{17}$ acting as resistors. This MISFET $Q_{18}$ operates to apply feedback to the cascade stage 3.

A reference voltage $V_{ref}$ is applied to the source of this MISFET $Q_{18}$. A load MISFET $Q_{19}$ is connected between the drain of MISFET $Q_{18}$ and the power source voltage $V_{ss}$. The reference voltage $V_{ref}$ has a value which is higher by the threshold voltage $V_{th}$ (about 0.45 V) of MISFET $Q_{18}$ than the intermediate level (2.5 V) of the circuit, that is, the intermediate level between $V_{DD}$ (5 V) and $V_{ss}$ (0 V) which intermediate level will also be referred to hereinafter as the "ground level"). Accordingly, when the gate voltage of MISFET $Q_{18}$ or the potential at node c is higher than the ground level, MISFET $Q_{18}$ is turned off, and when it is lower than the ground level, MISFET $Q_{18}$ is turned on so that a bias current flows through MISFETs $Q_{18}$ and $Q_{19}$.

Figure 3A:
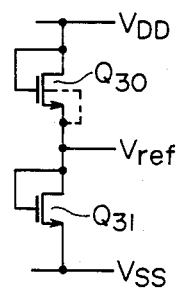
FIGS. 3A and 3B are circuit diagrams, each showing a reference voltage generation circuit.

FIG. 3A shows a circuit diagram of a reference voltage generation circuit which can be used to provide the voltage $V_{ref}$ in FIG. 1. The circuit shown in the figure consists of two N-channel MISFETs $Q_{30}$ and $Q_{31}$ connected in series between the power source terminals $V_{DD}$ and $V_{ss}$. The gate of each transistor $Q_{30}$, $Q_{31}$ is connected to its drain so that the transistors operate as voltage-dividing resistors. The reference voltage $V_{ref}$ is produced from the common junction of the source of MISFET $Q_{30}$ and the drain of MISFET $Q_{31}$ by selecting appropriate conductances for each of the transistors $Q_{30}$ and $Q_{31}$. Although the invention is not particularly limited to this, the substrate gate of MISFET $Q_{30}$ in this embodiment is connected to its source in the same way as in MISFET $Q_{31}$. Accordingly, the potential difference between the source and substrate gate of MISFET $Q_{30}$ is kept at zero irrespective of the level of the reference voltage $V_{ref}$. In other words, the conductance characteristics of MISFET $Q_{30}$ are not affected by the substrate effect. The conductance characteristics of MISFET $Q_{31}$ are not affected by the substrate effect, either. As a result, in the circuit shown in the drawing the reference voltage $V_{ref}$ is output at the desired level irrespective of changes in the voltage between the power source terminals $V_{DD}$ and $V_{ss}$.

Figure 3B:
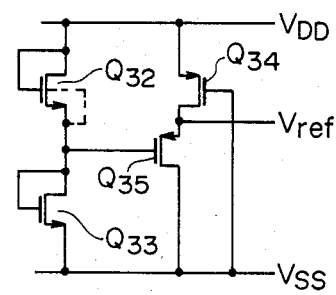

FIG. 3B is a circuit diagram of another reference voltage generation circuit which can be used to generate the voltage $V_{ref}$ in FIG. 1. In this example, the bias voltage applied to the gate of a MISFET $Q_{35}$ is produced by MISFETs $Q_{32}$ and $Q_{33}$. This bias voltage has an intermediate value between that of the terminals $V_{DD}$ and $V_{ss}$ because MISFETs $Q_{32}$ and $Q_{33}$ have the same conductance characteristics. A MISFET $Q_{34}$ is connected between the source of MISFET $Q_{35}$ and terminal $V_{DD}$ in order to apply a bias current to this transistor $Q_{35}$. The MISFETs shown in the figure are fabricated by IC fabrication techniques at the same time as the fabrication of the MISFETs of FIG. 1. Accordingly, the P-channel MISFET $Q_{35}$ has the same threshold voltage as that of MISFET $Q_{18}$ shown in FIG. 1. The reference voltage $V_{ref}$ produced from the source of MISFET $Q_{35}$ is raised by the threshold voltage above the intermediate level. If this IC is operated by two positive and negative power sources and has a ground terminal, the gate of MISFET $Q_{35}$ in FIG. 3B may be connected to this ground terminal. The ground terminal is connected to the grounding point of the circuit if the IC is operated by the two positive and negative power sources. If the IC is operated only by positive power sources, the ground terminal is kept open. The gate voltage of MISFET $Q_{35}$ in this case is determined by the MISFETs $Q_{32}$ and $Q_{33}$.

Turning back to FIG. 1, MISFET $Q_{20}$ having the same conductivity type as the MISFET $Q_{19}$ is provided parallel to it. These MISFETs $Q_{19}$ and $Q_{20}$ are connected so as to form a current-mirror circuit. When the MISFET $Q_{18}$ is turned on and a current flows through the MISFET $Q_{19}$, a current proportional to the W/L ratio (W: channel width, L: channel length) of MISFET $Q_{19}$ flows through MISFET $Q_{20}$.

A MISFET $Q_{21}$ is connected between the drain of the MISFET $Q_{20}$ and the common drain of the MISFETs $Q_7$ and $Q_8$. The current that should flow through the MISFET $Q_{20}$ is supplied from the bias circuit 1 through the MISFET $Q_{21}$.

Because the MISFET $Q_{21}$ is designed so as to have a rather high resistance, any adverse effects of the feedback are exerted upon the bias circuit 1. The potential of the connection node d of the MISFETs $Q_{20}$ and $Q_{21}$ is applied to the gates of the MISFETs $Q_{10}$ through $Q_{13}$ of the cascade stage 3.

The operating points of nodes $b_1$ and $b_2$ are set at appropriate levels in order to provide effective feedback to the gates of the MISFETs $Q_{10}$ to $Q_{13}$ from node c, although the invention is not particularly limited to this arrangement. In other words, the operating points of nodes $b_1$ and $b_2$ are set so that the potential at node c, when the feedback loop of the MISFETs $Q_{18}$ to $Q_{21}$ is not there, drops but is greater by at least the threshold voltage of the MISFET $Q_{18}$ than the reference voltage $V_{ref}$.

The operating points of nodes $b_1$ and $b_2$ can be set in the following manner. The gate width W of each transistor $Q_{12}$, $Q_{13}$ or each transistor $Q_{14}$ or $Q_{15}$ is set in advance to be greater than that of each transistor $Q_3$, $Q_4$ and $Q_{10}$, $Q_{11}$. According to this arrangement, the operating resistances of MISFETs $Q_{12}$ to $Q_{15}$ become smaller than those of MISFETs $Q_3$, $Q_4$, $Q_{10}$ and $Q_{11}$, so that the voltage at nodes $b_1$, $b_2$ can be reduced to the power source voltage $V_{ss}$.

The output stage 4 consists of MISFETs $Q_{22}$ and $Q_{23}$ that are connected in series between the power source voltages $V_{DD}$ and $V_{ss}$. The potential of one ($b_2$) of the output nodes of the cascade stage 3 is applied to the gates of these transistors $Q_{22}$ and $Q_{23}$ which form a kind of CMOS inverter. An output voltage $V_{out}$ is taken from a connecting node e of these MISFETs $Q_{22}$ and $Q_{23}$. Symbols $c_1$, $c_2$ and $c_3$ represent phase-compensating capacitors that are provided between the cascade stage 3 and a node e' of the output stage 4.

Next the operation of the above differential amplifier will be described. As an example, it is assumed that a positive input is applied to the gate terminal (input $IN_1$) of the input MISFET $Q_1$ of the differential input stage 2, and a negative input to the gate terminal (input $IN_2$) of the input MISFET $Q_2$.

The circuit is operated in this case in such a fashion that the potential at the output node $a_1$ of the differential input stage 2 becomes relatively negative and the potential at node $a_2$ becomes relatively positive. Because the MISFETs $Q_{10}$ and $Q_{11}$, to which the potentials of nodes $a_1$ and $a_2$ are applied, form a gate-ground circuit, the bias between the source and gate of the MISFET $Q_{11}$ becomes large in response to a high source input potential. Since the drain current of the MISFET $Q_{11}$ increases in response to the large bias, the drain voltage (at node $b_2$) becomes relatively positive. In contrast, the drain voltage (at node $b_1$) of the MISFET $Q_{10}$ becomes relatively negative in response to the relatively negative potential at node $a_1$.

Although the present invention is not particularly limited to this, the MISFETs $Q_3$ and $Q_4$ have very low impedances in order to make it possible to drive MISFETs $Q_{10}$ and $Q_{11}$ sufficiently by the input stage 2. For this reason, there is hardly any gain in the input stage 2, but in contrast the gain in the cascade stage 3 is extremely. For example, the gain from node $a_2$ to node $b_2$ can be as high as approximately 50 dB.

When the input $IN_1$ is kept at a relatively positive potential and the input $IN_2$ at a relatively negative potential, as described above, node $b_2$ is kept at a relatively positive potential. The potential of node $b_2$ is applied to the gates of the MISFETs $Q_{22}$ and $Q_{23}$ of the output stage. Hence, the conductance of the MISFET $Q_{22}$ is reduced and the conductance of MISFET $Q_{23}$ is increased. Accordingly, the output voltage $V_{out}$, which is proportional to the voltage of the output node $b_2$ of the cascade state 3 (which is amplified by about 20 dB, for example) and has the opposite phase, is output from the output node e of the output stage 4.

When the operating points of the nodes $b_1$ and $b_2$ are kept at a relatively high potential in the circuit shown in the figure, their operating points will be as follows.

The potential at the connection node c of the MISFETs $Q_{16}$ and $Q_{17}$ connected between the output nodes $b_1$ and $b_2$ of the cascade stage 3 is set to the intermediate level between the potentials of nodes $b_1$ and $b_2$. As described previously, the source voltage of the MISFET $Q_{18}$ which has at its gate the potential of node c is set to the reference voltage $V_{ref}$ which is higher than the ground level by the threshold voltage. Accordingly, if the potential of node c is at a level that is higher than the ground level of the circuit, for example, the MISFET $Q_{18}$ is turned off and no current flows to the MISFETs $Q_{19}$ and $Q_{20}$. In this case, therefore, there is substantially no feedback to the cascade stage 3 through the MISFETs $Q_{18}$ to $Q_{20}$.

The operating points at nodes $b_1$ and $b_2$ in this condition are determined by the conductance characteristics of the MISFETs $Q_3$, $Q_4$ and $Q_{10}$ to $Q_{15}$. However, their operating points fluctuate or change markedly in this state. For example, the relative characteristics between the MISFETs $Q_3$ and $Q_4$ and the MISFETs $Q_{10}$ and $Q_{11}$ cause variations that cannot be neglected, in accordance with variations in the fabricating conditions of the IC. The characteristics of the P-channel MISFETs $Q_3$, $Q_4$, $Q_{10}$ and $Q_{11}$ relative to those of the N-channel MISFETs $Q_{12}$ to $Q_{15}$ also cause variations that cannot be neglected. The gate-source voltage-to-drain current characteristics of MISFETs are temperature dependent, as is well known in the art. The temperature characteristics of P-channel MISFETs are liable to be different from those of the N-channel MISFETs. The temperature of the semiconductor substrate when the circuit is operating is raised by the heat generated by circuit elements such as MISFETs, and temperature gradients are formed between circuit elements generating a lot of heat and circuit elements generating less heat. In consequence, differences in operating temperatures, which cannot be neglected, occur between the MISFETs shown in the figure.

Since the cascade stage 3 is designed to have a relatively large gain, the operating points of nodes $b_1$ and $b_2$ are affected markedly by variations and changes in the characteristics of the MISFETs. The output level of the output stage 4 can change significantly in response to changes in the operating point of node $b_2$. As described previously, however, this embodiment is designed so that the operating points of nodes $b_1$ and $b_2$ have relatively low values when the feedback loop consisting of the MISFETs $Q_{18}$ to $Q_{21}$ is not provided. For this reason, the potential at node c turns the MISFET $Q_{18}$ on, and the operation of the feedback loop is made effective as will be described in more detail later. The operating points of nodes $b_1$ and $b_2$ are set at appropriate values by the operation of the feedback loop.

When the potentials at the output nodes $b_1$ and $b_2$ of the cascade stage 3 are reduced in the circuit shown in the figure, the potential at the common connection node c of the MISFETs $Q_{16}$ and $Q_{17}$ serving as resistors is also reduced in response. As the potential drops at node c, the MISFET $Q_{18}$ is turned on strongly and a large bias current starts to flow through MISFET $Q_{19}$. A bias voltage whose level is increased by the MISFET $Q_{19}$ is generated, and the current supplied from the bias circuit 1 to the MISFET $Q_{20}$ through the MISFET $Q_{21}$ is increased. Hence, the potential at the connection node d of the MISFETs $Q_{20}$ and $Q_{21}$ decrease and the gate potentials of the MISFETs $Q_{10}$ through $Q_{13}$ also decrease.

When the potential at node d drops, the gate-source voltage of the MISFETs $Q_{10}$ and $Q_{11}$ increase and the gate-source voltages of the MISFETs $Q_{12}$ and $Q_{13}$ decrease. The bias current supplied to each node $b_1$, $b_2$ via $Q_{10}$, $Q_{11}$ increases in response to the increase in the gate-source voltage of each of these MISFETs $Q_{10}$ and $Q_{11}$. As a result, the potentials at the output nodes $b_1$ and $b_2$ increase. In other words, negative feedback is applied to the gates of the MISFETs $Q_{10}$ through $Q_{13}$ of the cascade stage 3 by the MISFETs $Q_{16}$ and $Q_{17}$ forming the resistance circuit, and by the MISFETs $Q_{18}$ through $Q_{21}$.

As the potentials of the nodes $b_1$ and $b_2$ approach the ground level as a result of the negative feedback, the potential at node c also comes near the ground level and the conductance of the MISFET $Q_{18}$ decreases. Accordingly, the operating point for the in-phase signal at the output node $b_2$ of the cascade stage 3 is stabilized at a level which is substantially equal to the ground level.

The feedback operation described above remains effective even when the operating conditions of the input stage 2 change. When the levels of the inputs $IN_1$ and $IN_2$ of the input stage 2 are increased, the drain current of the constant-current MISFET $Q_5$ increases in response to the increase of these levels. Here the MISFET $Q_5$ is not an ideal constant-current source, the drain current of this MISFET $Q_5$ increases due to the effective channel-length modulation effect. The operating currents of the MISFETs $Q_1$ and $Q_2$ increase and the levels of nodes $a_1$ and $a_2$ decrease. On the other hand, when the levels of the input $IN_1$ and $IN_2$ are reduced, the levels of nodes $a_1$ and $a_2$ increase in response. The source-gate voltages of the MISFETs $Q_{10}$ and $Q_{11}$ of the cascade stage 3 change in accordance with the potential changes of nodes $a_1$ and $a_2$. However, the operating points of nodes $b_1$ and $b_2$ are kept at the desired values by the feedback operation of the MISFETs $Q_{18}$ through $Q_{21}$.

In the circuit of the embodiment described above, the cascade stage 3 alone generally cannot provide an output signal having a sufficient amplitude for most desired usages. Accordingly, the output stage 4 is added in order to amplify the output signal to the power source voltage. However, this output stage 4 need not always be provided and, in some cases, an output from the cascade stage 3 having a small amplitude can be utilized as it is for providing a signal to a circuit in the next stage.

In the embodiment shown, the substrate and source of the MISFET $Q_7$ forming the bias circuit 1 and those of the MISFETs $Q_{12}$ and $Q_{13}$ forming the cascade stage 3 are connected to one another in order to eliminate the back-gate effect (substrate effect) at the MISFETs $Q_7$, $Q_{12}$ and $Q_{13}$, and thus reduce the threshold voltage $V_{th}$.

In the embodiment, the substrate and sources of the input MISFETs $Q_1$ and $Q_2$ forming the input stage 2 are also connected to one another so as to reduce $V_{th}$ and the lower limit of the operating voltage of the input stage.

As described above, the present invention connects a resistor circuit to the output nodes of a cascade stage including MISFETs which receive an output from a differential input stage as their source inputs, so that the resistor circuit generates a potential at an intermediate level in accordance with the outputs of the cascade stage, the intermediate-level potential in turn actuates the MISFET $Q_{18}$ so as to enable the flow of a bias current to apply negative feedback to the MISFETs $Q_{10}$ through $Q_{13}$ via MISFETs $Q_{19}$ through $Q_{21}$. This circuit arrangement provides a stabilization point which is determined by the circuit itself so that the operating point of the circuit can therefore be stabilized, and so that the dynamic range of the circuit can be ensured sufficiently.

The present invention is not particularly limited to the embodiment described above. For example, the bias current supplied to the gates of the constant-current MISFETs $Q_{14}$ and $Q_{15}$ may be generated by the feedback circuit 5. In such a case, a fixed bias voltage could be applied to the gates of the MISFETs $Q_{10}$ and $Q_{11}$. Also, as noted previously, MISFETs $Q_{12}$ and $Q_{13}$ which reduce the drain potentials of the constant-current MISFETs $Q_{14}$ and $Q_{15}$ can be omitted. Further, although the intermediate voltage between $V_{DD}$ and $V_{ss}$ has been referred to throughout as the "ground level", and can, in fact, be at a zero voltage, the circuit can be arranged to operate at intermediate voltages other than a zero voltage.

It is to be understood that the above-described arrangements are simply illustrative of the application of the principles of this invention. Numerous other arrangements may be readily devised by those skilled in the art which embody the principles of the invention and fall within its spirit and scope.

I claim:
1. A differential amplifier comprising:
    a pair of differential input field-effect transistors with channels of a first conductivity type;
    a current-mirror load circuit which is comprised of first and second field-effect transistors with channnesl of a second conductivity type connected between the drains of said pair of differential input field-effect transistors and a first power terminal;
    a third field-effect transistor with a channel of the second conductivity type receiving at its source a signal from the junction between the drain of said first field-effect transistor of said current-mirror load circuit and the drain of one of said pair of differential input field-effect transistors;
    a fourth field-effect transistor with a channel of the second conductivity type receiving at its source a signal from the junction between the drain of said second field-effect transistor of said current-mirror load circuit and the drain of the other of said pair of differential input field-effect transistors;
    a load circuit which forms a current path between the drains of said third and fourth field-effect transistors and a second power terminal;
    a voltage generation circuit which generates a bias voltage applied to the gates of said third and fourth field-effect transistors, and
    feed back means coupled between the drains of said third and fourth field-effect transistors and the gates of said third and fourth field-effect transistors, said feedback means including means for controlling the voltage level of the gate bias on said gates of said third and fourth field-effect transistors in accordance with the voltage level at said drains of said third and fourth field-effect transistors.

2. A differential amplifier according to claim 12, wherein said feedback means includes means for dividing the drain voltages of said third and fourth field-effect transistors to provide a divided voltage signal indicative of the level of said drain voltages, means for comparing said divided voltage signal with a reference voltage, and means for adjusting the gate bias on said third and fourth field-effect transistors to stabilize the drain voltages of said third and fourth field-effect transistors to a value determined by the level of said reference voltage.

3. A differential amplifier according to claim 2, wherein said dividing means comprises a first resistance element which receives at one of its ends the output of said third field-effect transistor and a second resistance element which receives at one of its ends the output of said fourth field-effect transistor and being connected at the other end to the other end of said first resistance element, and wherein said dividing means produces the divided voltage signal at the common junction of said first and second resistance.

4. A differential amplifier according to claim 3, wherein each of said first and second resistance elements is comprises of a field-effect transistor.

5. A differential amplifier according to claim 2, further comprising a constant current source connected to the sources of said pair of differential input field-effect transistors.

6. A differential amplifier according to claim 5, wherein said constant-current source comprises a fifth field-effect transistors of said first conductivity type, and wherein said load circuit comprises a sixth field effect transistor coupled to the drain of said thrid field effect transistor and a seventh transistor coupled to the drain of the fourth field effect transistor.

7. A differential amplifier according to claim 6, wherein the drain of said sixth field-effect transistor of load circuit is connected to the drain of said third field-effect transistor via an eighth field-effect transistor, and the drain of said seventh field-effect transistor of said load circuit is connected to the drain of said fourth field-effect transistor via a ninth field-effect transistor, whereby the levels of voltages applied to the drains and sources of said sixth and seventh field-effect transistors are reduced.

8. A differential amplifier according to claim 7, wherein said eighth and ninth field-effect transistors have channels of said first conductivity type, and wherein said feedback means controls to voltage levels applied to the gate of each of said eighth and ninth field-effect transistors.

9. A differential amplifier according to claim 5, further comprising an output amplifier which receives the output of said fourth field-effect transistors at its output.

* * * * *